United States Patent [19]

Misawa

[11] 4,165,500
[45] Aug. 21, 1979

[54] TUNING INDICATING DEVICE HAVING A TWO-DIMENSIONAL DISPLAY OF TWO VALUES

[75] Inventor: Akira Misawa, Tokyo, Japan

[73] Assignee: Pioneer Electronic Corporation, Tokyo, Japan

[21] Appl. No.: 870,964

[22] Filed: Jan. 19, 1978

[30] Foreign Application Priority Data

Jan. 24, 1977 [JP] Japan .................................. 52-6626

[51] Int. Cl.² ............................ H03J 1/04; H03J 1/02; H01J 1/62
[52] U.S. Cl. ........................................ 334/86; 334/36; 313/510
[58] Field of Search ............................ 334/30, 36, 86; 116/124.4, DIG. 29, DIG. 30; 313/506, 510, 513

[56] References Cited

U.S. PATENT DOCUMENTS

| | | | |
|---|---|---|---|
| 1,893,421 | 1/1933 | Latzko et al. | 334/86 |
| 2,755,457 | 7/1956 | Diemer et al. | 334/30 |
| 2,790,161 | 4/1957 | Joorman | 334/30 |

FOREIGN PATENT DOCUMENTS 1265241  4/1968  Fed. Rep. of Germany.

*Primary Examiner*—Alfred E. Smith
*Assistant Examiner*—Harry E. Barlow
*Attorney, Agent, or Firm*—Sughrue, Rothwell, Mion, Zinn and Macpeak

[57] ABSTRACT

A tuning indicating device in a radio tuner displays S-meter and T-meter tuning information in a single, two-dimensional display. The display unit forms a two-dimensional pattern in response to drive signals corresponding to the S-meter and T-meter tuning information and preferably comprises two groups of electrodes disposed to sandwich a plate-shaped member made of a material whose optical characteristic is changed in response to an electrical field strength applied thereto. One of the groups of electrodes is a plurality of film electrodes which are aligned in one and the same direction, while the other is a plurality of film electrodes which are arranged in such a manner that the configurations thereof are different from one another gradually in a predetermined direction and which are aligned in a direction different from the direction of the one group of film electrodes.

7 Claims, 19 Drawing Figures

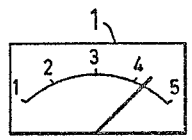
FIG. 1 PRIOR ART
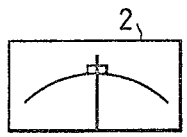
FIG. 2 PRIOR ART
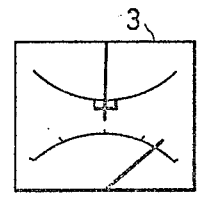
FIG. 3A
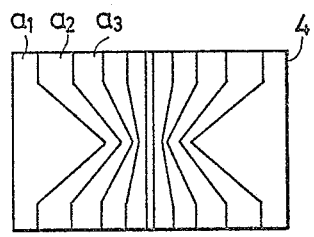
FIG. 3B
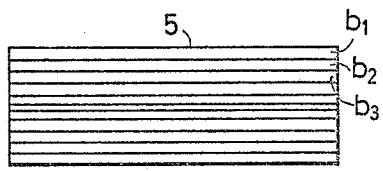
FIG. 4
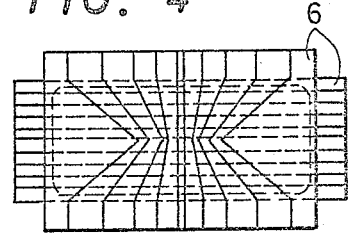
FIG. 5
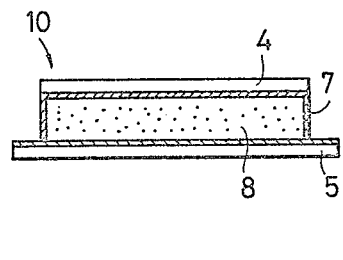
FIG 6A
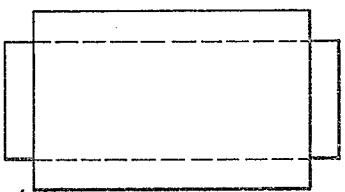
FIG 6B
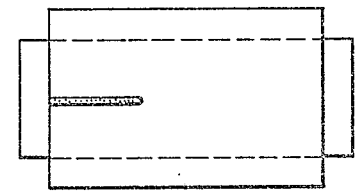
FIG 6C
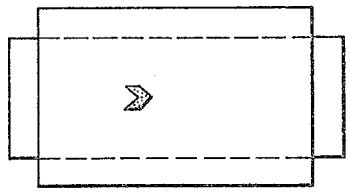
FIG 6D
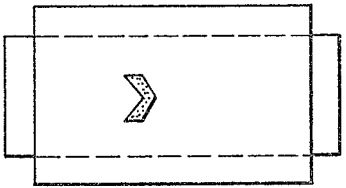
FIG 6E
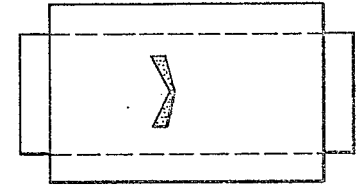
FIG 6F
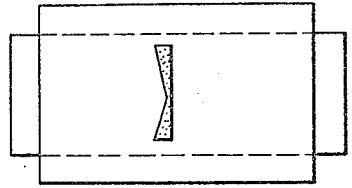
FIG 6G
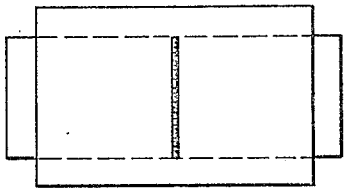

TUNING INDICATING DEVICE HAVING A TWO-DIMENSIONAL DISPLAY OF TWO VALUES

BACKGROUND OF THE INVENTION

This invention relates to radio tuners, and more particularly to a tuning indicating device in a tuner employed in a radio receiver.

A conventional tuning indicating device in an FM tuner employs a pointer indication type signal strength meter (hereinafter referred to as "an S-meter" when applicable) and a pointer indication type center tuning meter (hereinafter referred to as "a T-meter" when applicable). In order to operate the S-meter, an intermediate frequency signal component derived from the IF stage is rectified to supply a rectified current to the S-meter. The pointer of the S-meter indicates the electric field strength. Therefore, a maximum deflection of the pointer indicates a best signal receiving condition. However, the S-meter suffers from a disadvantage that if the input is greater than that with which the limiter circuit operates satisfactorily, it is difficult to clearly obtain the maximum deflection point, that is, the best signal receiving condition. In order to overcome this difficulty, the high-grade radio receiver employs the aforementioned T-meter in combination with the S-meter to obtain the best signal receiving condition. The T-meter utilizes the S-figure characteristic which is obtained from the ratio detector. If the voltage of the S-figure characteristic is read with the T-meter and the central frequency of the received signal is set to the center of the S-figure where the voltage is at zero, the signal reception can be achieved with the best S/N ratio, the minimum distortion, the maximum output, and the best separation. When the S-meter and the T-meter are employed in combination, the arrangement of these meters is as indicated by reference numerals 1 and 2 in FIG. 1.

However, this tuning indicating device is still disadvantageous in that (1) it is necessary to provide two meters, (2) it is necessary to read the two meters, and (3) the meters are liable to become out of order because they are electro-mechanical meters. In order to overcome the above-described difficulties (1) and (2), a method has been proposed in which the S-meter and the T-meter are provided in one casing 3 as indicated in FIG. 2. However, it is difficult to completely overcome the above-described difficulties because the arrangement of the meter shown in FIG. 2 is fundamentally similar to that of the two meter system.

SUMMARY OF THE INVENTION

Accordingly, an object of the invention is to provide a tuning indicating device which is so designed that information from the S-meter and information from the T-meter can be read in only one display, and which is less liable to become out of order.

A tuning indicating device according to this invention is so designed that an information signal to a conventional S-meter and a conventional T-meter is applied to a display unit capable of displaying a two-dimensional pattern, whereby the information to the S-meter and T-meter is displayed as a two-dimensional pattern variation on the single display device.

BRIEF DESCRIPTION OF THE DRAWINGS

In the drawings:

FIGS. 1 and 2 are schematic diagrams illustrating conventional tuning indicating devices in an FM tuner;

FIGS. 3A and 3B are sectional views showing the electrodes of a display unit employed in a tuning indicating device in a tuner according to this invention;

FIG. 4 is a front view of the unit shown in FIGS. 3A and 3B;

FIG. 5 is a sectional view of the unit shown in FIGS. 3A, 3B and 4;

FIGS. 6A to 6G are diagrams illustrating the operation of the display unit in the tuning indicating device according to the invention;

DESCRIPTION OF THE PREFERRED EMBODIMENTS

Figure 7:
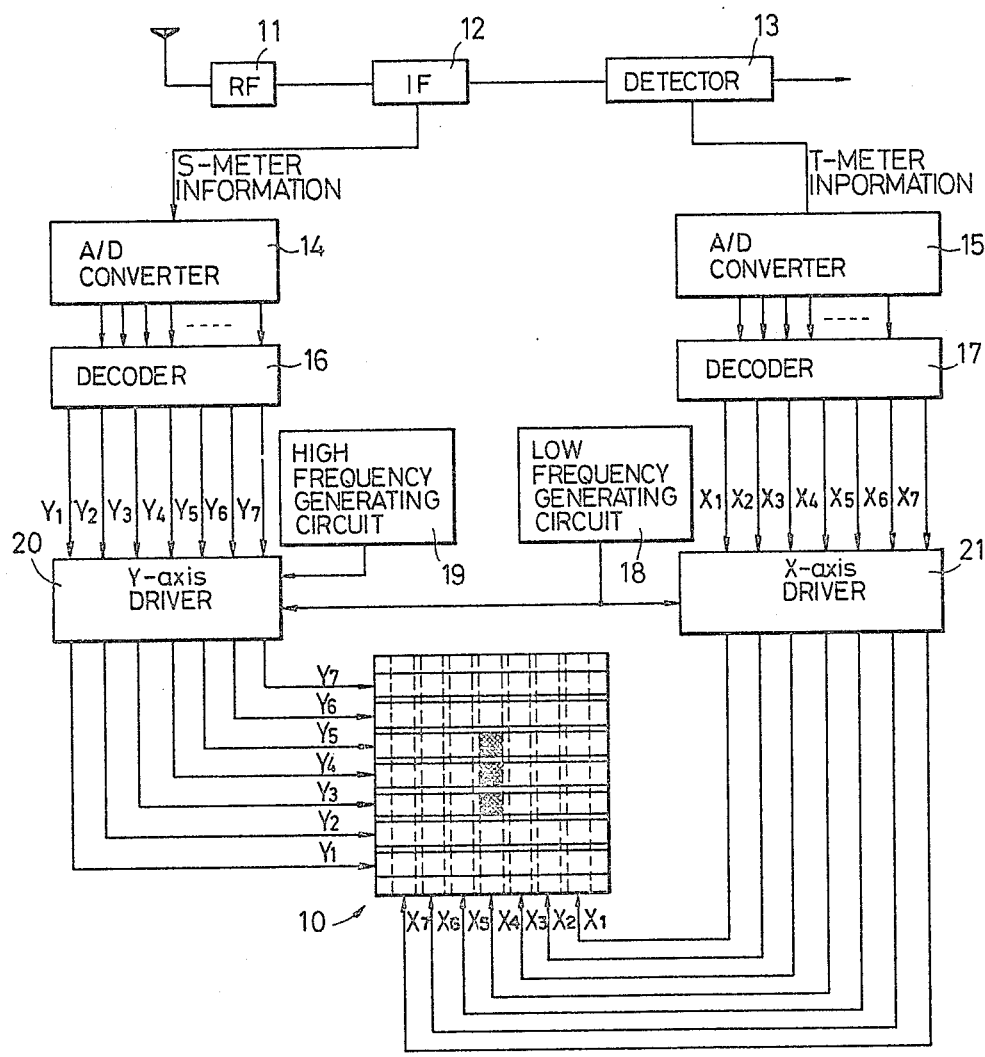
FIG. 7 is a block diagram showing one example of the tuning indicating device according to the invention.

FIGS. 3 through 5 show one example of a display unit employed in the tuning indicating device according to the invention. The display unit 10 is provided with a front transparent substrate 4 made of glass or the like, on one surface of which a plurality of first transparent film electrodes $a_1, a_2, a_3 \ldots$ are provided and are insulated from one another. It is preferable that, as shown in FIG. 3A, the film electrodes $a_1, a_2, a_3 \ldots$ are V-shaped strips whose angles of opening gradually increase as their positions approach the center of the substrate 4. The display unit 10 is further provided with a rear transparent substrate 5 made of glass or the like, on one surface of which a plurality of second film electrodes $b_1, b_2, b_3 \ldots$ are formed and are insulated from one another. These electrodes are made of a metal such as tin oxide, indium oxide or the like and are formed by sputtering or spraying in a conventional manner. The marginal edges of the film electrodes are formed as X-direction and Y-direction drive signal receiving terminals 6 as shown in FIG. 4. A spacer 7 is disposed between the front substrate 4 and the rear substrate 5 in such a manner that the electrode surfaces thereof confront each other. A plate-shaped member 8 made of a material such as a liquid crystal material whose optical characteristic is varied according to an electrical field applied thereto, is interposed between the two substrates 4 and 5.

The display unit is driven so as to display two-dimensional patterns as shown in FIGS. 6A through 6G. FIG. 6A shows the case of complete detuning. In this case, the X-direction T-meter information is at the center, but the electrical field strength is very low, and therefore no display is provided. As the tuning knob is turned, the state indicated in FIG. 6B is obtained. This means that the electrical field strength is low, but the station is near. As the tuning knob is further operated, as shown in FIGS. 6C through 6F the Y-direction S-meter information is changed by the electrical field strength while the X-direction is changed by the T-meter information. Finally, the best signal receiving state as shown in FIG. 6G can be obtained. The display system may be of the dynamic scattering mode, the field effect mode, the transmission type, or the reflection type. Negative or positive display can be effected also. In the case of the reflection type, it is possible to insert characters by printing them on the reflecting plate.

FIG. 7 shows one example of a drive circuit for the display unit 10. A tuner front end section 11, an intermediate frequency signal amplifier 12, and a detector section 13 are provided as is conventional. The display unit 10 displays a two-dimensional pattern according to drive signals in at least two directions, for instance, along the X-axis and the Y-axis. The display unit 10 shown in FIG. 7 has seven coordinates $X_1$ through $X_7$ along the X-axis, and seven coordinates $Y_1$ through $Y_7$ along the Y-axis.

An analog signal representing the S-meter information from the intermediate frequency amplifier section 12 is digitized by an analog-to-digital (A/D) converter 14, while an analog signal representing the T-meter information is digitized by the A/D converter 15. These digital signals are converted into an X-axis coordinate signal and a Y-axis coordinate signal by decoders 16 and 17, respectively. In the case illustrated by the shading on display unit 10 in FIG. 7, the output signal $X_4$ out of the output signals X is made to have an "H" level and the remaining output signals $X_n$ are made to have an "L" level, while the output signals $Y_3$, $Y_4$ and $Y_5$ are made to have an "H" level, and the remaining output signals are made to have an "L" level.

Figure 8A:
FIGS. 8A, 8B and 8C are diagrams showing the waveforms of signals appearing in the circuit shown in FIG. 7.
Figure 8B:
Figure 8C:

A low frequency generating circuit 18 and a high frequency generating circuit 19 provide pulses as indicated in FIGS. 8A and 8C, respectively. A Y-axis driver 20 operates to provide pulses in response to the output signals from the decoder 16. For instance, the Y-axis driver 20 provides low frequency pulses in response to the outputs $Y_3$, $Y_4$ and $Y_5$ and high frequency pulses in response to the other outputs. An X-axis driver 21 also operates to provide pulses in response to the output signals from the decoder 17. For instance the X-axis driver 21 provides pulses as shown in FIG. 8B which are obtained by inverting the low frequency pulses described above in response to the output $X_4$. The X-axis driver also provides pulses as shown in FIG. 8A in response to the other outputs.

As a result, the optical characteristic of the liquid crystal in the portions $X_4$-$Y_5$, $X_4$-$Y_4$ and $X_4$-$Y_3$ is changed, but the optical characteristic of the liquid crystal in the portions $X_5$-$Y_5$, $X_5$-$Y_4$, $X_5$-$Y_3$, $X_6$-$Y_5$, $X_6$-$Y_4$, $X_6$-$Y_3$, $X_7$-$Y_5$, $X_7$-$Y_4$, $X_7$-$Y_3$, $X_3$-$X_5$, $X_3$-$X_4$, $X_3$-$X_3$, $X_2$-$X_5$, $X_2$-$Y_4$, $X_2$-$Y_3$, $X_1$-$Y_5$, $X_1$-$Y_4$ and $X_1$-$Y_3$ is not changed because in-phase pulses are applied thereto with the result that no net voltage is applied thereto. The high frequency is applied to portions $X_4$-$Y_7$, $X_4$-$Y_6$, $X_4$-$Y_2$ and $X_4$-$Y_1$ and the other portions, as a result of which the liquid crystal cannot follow the high frequency signal, and therefore no display is made there. The low frequency signal is from 10 Hz to several KHz, the high frequency signal is from several KHz to several hundred KHz, and the drive voltage to the display unit is from 3 to 5 volts.

Figure 9:
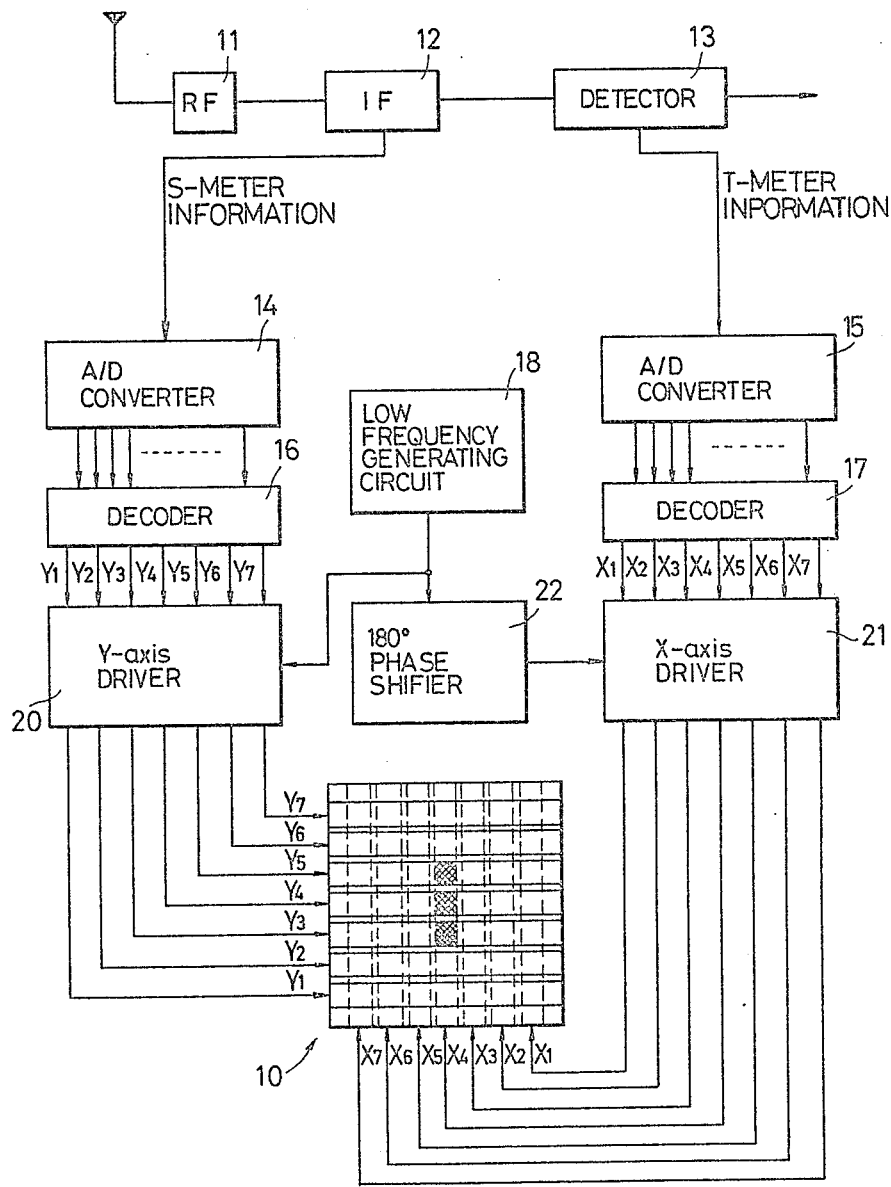
FIGS. 9 and 10 are block diagrams showing other examples of the tuning indicating device according to the invention.

FIG. 9 shows another embodiment of this invention in which a plasma display unit 10 is employed. The plasma display unit 10 comprises electrodes arranged in the same manner as that in the liquid crystal display unit, and a plate-shaped luminous member emitting light in response to voltage applied thereto, the member being interposed between the electrodes. The drive circuit for the plasma display unit 10 is substantially similar to that in FIG. 7 with the exception that the high frequency generating circuit 19 is omitted and a 180° phase shifter 22 is provided. The X-axis driver 21 provides low frequency pulses generated in response to decoder 17 outputs corresponding to the "H" level and a certain signal in response to decoder 17 outputs corresponding to the "L" level. The Y-axis driver 20 operates similarly as in the X-axis driver. Sometimes the plasma display unit employs a booster circuit because it needs a drive voltage on the order of 150 V. The operation starting voltage of the plasma display unit is 100 to 120 V, and therefore it is necessary to take the effect of cross-talk voltage into account.

Figure 10:
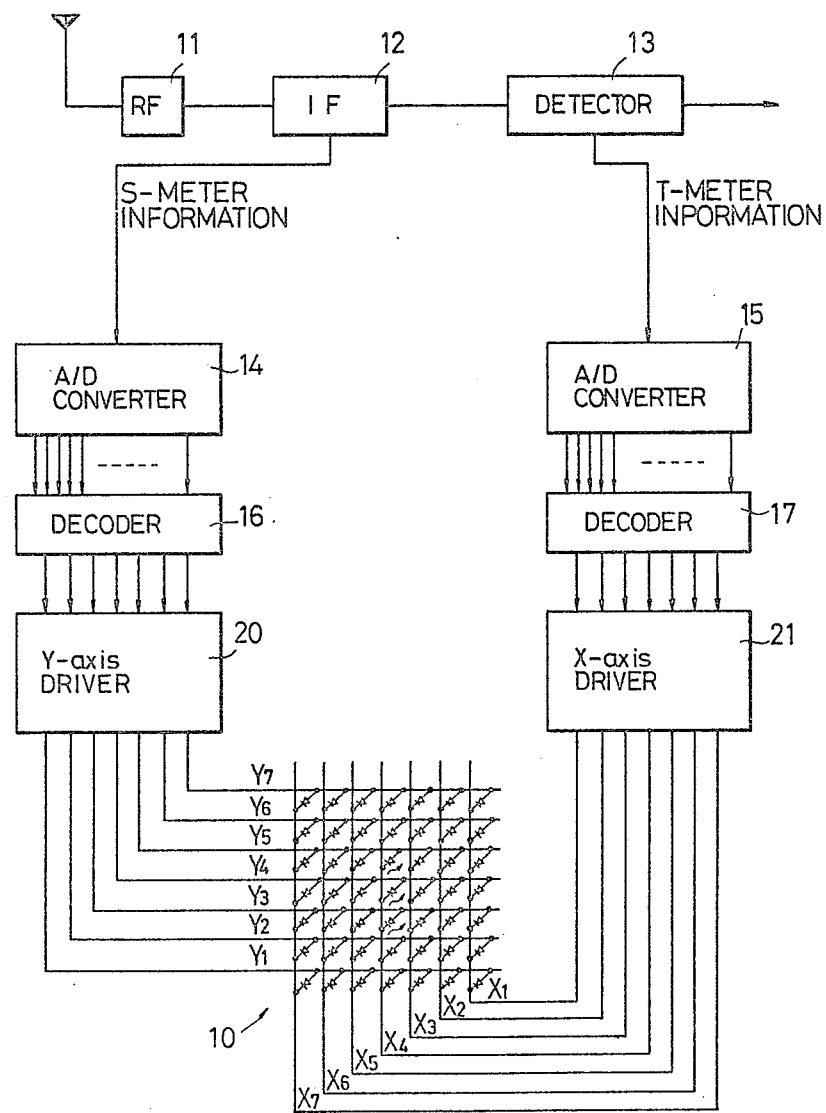

FIG. 10 shows another embodiment of the invention in which the display unit 10 is made up of light emission diodes (LED). The arrangement of the device is substantially similar to that in FIG. 7 except that the low frequency and high frequency generating circuits 18 and 19 are omitted. In this device, the X-axis and Y-axis drivers operate merely as current buffers and do not carry out logical operation.

In addition to the above-described display units, luminous elements such as gas discharge tubes, and fluorescent display tubes can be employed in the device according to the invention. Furthermore, it is obvious that a display unit capable of displaying patterns which have half-tones or are colored can be employed in the device of the invention.

While the invention has been shown and described specifically with reference to the tuning indicating device in the FM tuner, there is intent to limit the spirit and scope of the invention to this device. Namely, since it is well known that the S and T meter informations can also be provided in an AM tuner and radio communication devices, it will be understood that the tuning indicating device according to the present invention is applicable in the AM tuner and the radio communication devices. Specifically, S-meter information can also be obtained in an AM tuner by employing a conventional discriminator as disclosed in U.S. Pat. No. 3,688,199 for forming an IF or intermediate frequency signal fed from an AM tuning stage and the T-meter information is ordinarily used in the AM tuner for indication of tuning. Thus, it will be appreciated that the tuning indicating device according to the present invention is applicable in the AM tuner.

What is claimed is:

1. A tuning indicating device in a radio tuner employing a first signal representing the strength of a selectively received signal and a second signal representing deviation of the frequency of said received signal from a predetermined central frequency, comprising:
   a display unit for displaying a two-dimensional pattern wherein each of the dimensions changes in response to a different drive signal; and
   drive means for converting said first and second signals into said drive signals.

2. A tuning indicating device as claimed in claim 1, wherein said display unit comprises a plurality of luminous elements arranged in the form of a matrix, said luminous elements being selectively excited by said drive signals.

3. A tuning indicating device as claimed in claim 1, wherein said display unit comprises:
   a plate-shaped member made of a material whose optical characteristic is changed in response to an electric field strength applied thereto; and
   two groups of electrodes disposed in such a manner as to sandwich said plate-shaped member therebetween, said drive means being connected to said two groups of electrodes.

4. A tuning indicating device as claimed in claim 3, wherein said material is a liquid crystal material.

5. A tuning indicating device as claimed in claim 3, whrerein said material is a plasma luminous material.

6. A tuning indicating device as claimed in claim 3, wherein one of said two groups of electrodes is a plurality of film electrodes which are aligned along one and the same direction, while the other is a plurality of film electrodes which are arranged in such a manner that the configurations thereof are different from one another gradually in a predetermined direction and which are aligned in a direction different from the direction of said one group of film electrodes.

7. A tuning indicating device as claimed in claim 6, wherein the film electrodes of said other group are V-shaped film electrodes each of whose angle of opening is different from one another and are arranged in such a manner that the angle of opening changes gradually as the positions thereof approach the center of said plate-shaped member from both ends thereof.

* * * * *